United States Patent
Fennelly et al.

(10) Patent No.: US 7,120,179 B2
(45) Date of Patent: Oct. 10, 2006

(54) APPARATUS AND METHOD FOR SETTING AC BIAS POINT OF AN OPTICAL TRANSMITTER MODULE IN AN OPTOELECTRONIC TRANSCEIVER

(75) Inventors: Robert L. Fennelly, San Jose, CA (US); Andreas Weber, Los Altos, CA (US); Jeffrey Bryant Price, Sunnyvale, CA (US); Stephan C. Burdick, Cupertino, CA (US); Gregory D. Woods, Belmont, CA (US); Greta L. Light, San Mateo, CA (US)

(73) Assignee: Finisar Corporation, Sunnyvale, CA (US)

( * ) Notice: Subject to any disclaimer, the term of this patent is extended or adjusted under 35 U.S.C. 154(b) by 324 days.

(21) Appl. No.: 10/703,698

(22) Filed: Nov. 6, 2003

(65) Prior Publication Data

US 2004/0144913 A1    Jul. 29, 2004

Related U.S. Application Data

(60) Provisional application No. 60/425,003, filed on Nov. 8, 2002.

(51) Int. Cl.
   *H01S 3/00*    (2006.01)
(52) U.S. Cl. ................... 372/38.02; 372/38.07
(58) Field of Classification Search ........... 372/29.015, 372/29.02, 29.021, 38.01, 38.02, 38.07
See application file for complete search history.

(56) References Cited

U.S. PATENT DOCUMENTS

| | | | |
|---|---|---|---|
| 6,446,867 B1 * | 9/2002 | Sanchez | 235/454 |
| 6,580,531 B1 * | 6/2003 | Swanson et al. | 398/5 |
| 6,661,817 B1 * | 12/2003 | Ames et al. | 372/29.021 |
| 6,862,302 B1 * | 3/2005 | Chieng et al. | 372/29.02 |
| 6,873,632 B1 * | 3/2005 | Hsieh | 372/38.02 |
| 6,947,455 B1 * | 9/2005 | Chieng et al. | 372/29.021 |
| 2003/0048505 A1 * | 3/2003 | Hakak | 359/127 |
| 2003/0113118 A1 * | 6/2003 | Bartur | 398/139 |
| 2004/0047376 A1 * | 3/2004 | Shapiro et al. | 372/38.02 |
| 2004/0067060 A1 * | 4/2004 | Aronson et al. | 398/135 |
| 2006/0098699 A1 * | 5/2006 | Sanchez | 372/26 |

* cited by examiner

*Primary Examiner*—Tan Ho
*Assistant Examiner*—Leith A. Al-Nazer
(74) *Attorney, Agent, or Firm*—Workman Nydegger

(57) ABSTRACT

An apparatus and method are provided for setting the AC and DC bias levels of a laser diode in an optoelectronic transceiver so as to control the device's extinction ratio. An optical output of the transceiver is looped back to an optical input of the transceiver. The method includes setting a DC bias level for the laser diode, setting an AC bias level for the laser diode to each of a predefined sequence of AC bias level settings, and receiving from the transceiver a sequence of optical output power measurements, the sequence of optical output power measurements including an average optical output power measurement corresponding to each of the AC bias level settings in the predefined sequence. From the received sequence of optical output power measurements preferred AC and DC bias level settings are determined and stored in the transceiver so as to control the AC and DC bias levels of the laser diode.

34 Claims, 6 Drawing Sheets

APPARATUS AND METHOD FOR SETTING AC BIAS POINT OF AN OPTICAL TRANSMITTER MODULE IN AN OPTOELECTRONIC TRANSCEIVER

This application claims priority to, and hereby incorporates by reference, U.S. provisional patent application 60/425,003, filed Nov. 8, 2002.

The present invention relates generally to the field of fiber optic transceivers. More particularly, the invention relates to optoelectronic transceivers and an apparatus and method for setting the AC bias point of an optical transmitter module in an optoelectronic transceiver.

BACKGROUND OF THE INVENTION

In order to maximize the performance and product life of an optoelectronic transceiver over a range of operating temperatures, the AC and DC bias levels of the optical transmitter module in the optoelectronic transceiver must be set at an optimal level for those temperatures within the operating range. These optimal levels correspond to operation where the "extinction ratio" and optical output power remain relatively constant. However, the operating characteristics of the laser diode in each transceiver module vary from module to module within a given product line. This variation prevents the utilization of global AC and DC bias settings throughout an entire product line whose components and configurations are otherwise identical. Therefore, the AC and DC bias levels for each module must be calibrated and set individually. Calibrating and setting the AC and DC bias levels of each individual laser diode for each transceiver is both expensive and time consuming.

Prior to the current invention, the AC and DC bias levels of a laser diode were set by using a test system that contains a digital communication analyzer ("DCA"). The DCA was used to monitor the optical output signal while varying the AC and DC bias levels of an optical transmitter module until the AC bias level that produces the optimal "extinction ratio" in the optical output signal is found. The DCA is a specialized oscilloscope with built-in software for measuring the "extinction ratio" of the laser diode. The primary disadvantage to using the DCA to set the AC and DC bias levels is cost—capital cost of the DCA itself and the time and costs associated with the configuration of the software and parameter settings of the test system. Furthermore, the test system is configured to only test and configure one optoelectronic transceiver at a time.

It would therefore be advantageous to have a method for setting the AC and DC bias levels of a laser diode without using a DCA. It would also be advantageous to provide a system and method capable of testing and configuring multiple optoelectronic transceivers simultaneously, without using a DCA.

BRIEF DESCRIPTION OF THE DRAWINGS

Additional objects and features of the invention will be more readily apparent from the following detailed description and appended claims when taken in conjunction with the drawings, in which:

DESCRIPTION OF EMBODIMENTS

Figure 1:
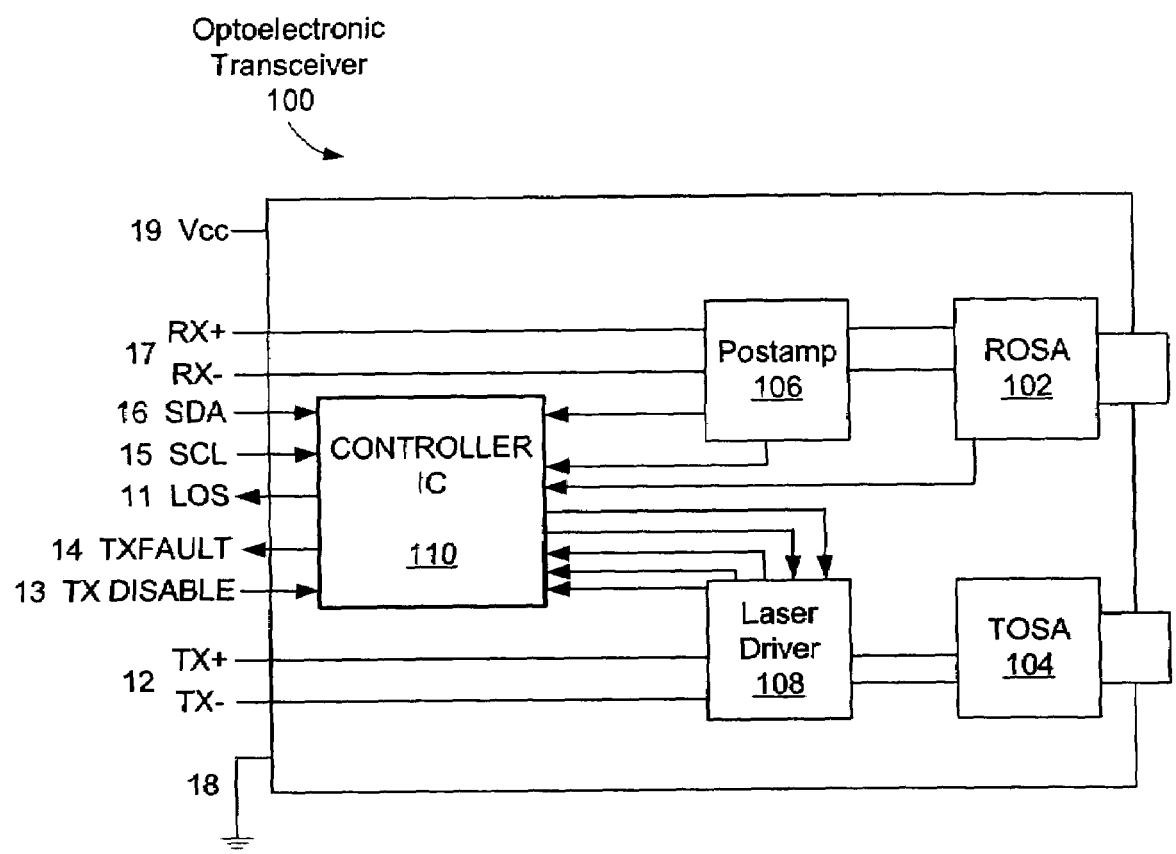
FIG. 1 is a block diagram of an optoelectronic transceiver.

Preferred embodiments of the invention are described below. In the interest of clarity, not all features of an actual implementation are described. It will be appreciated that in the development of any such embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Overview

In an optoelectronic transceiver, the AC and DC bias levels of an optoelectronic transmitter, such as a laser diode, are determined without using a digital communication analyzer. Instead, the optical output signal is looped back to the receiver of the transceiver. Measurements automatically made inside the transceiver are then used to determine the correct AC and DC bias levels for the transmitter.

An optoelectronic transceiver testing and configuration apparatus, in which an optoelectronic transceiver is mounted on an evaluation board, is situated in a temperature controlled chamber. A host computer is coupled to the temperature controlled chamber and to the optoelectronic transceiver through the evaluation board.

A transceiver includes a post amplifier that generates an "average received optical power" signal indicating the average optical power received by an optical signal receiver (e.g., photo diode) in the transceiver. The transceiver also includes a controller circuit or module that includes an analog to digital converter that converts the "average received optical power" signal into a digital value that is stored in a memory inside the transceiver. The optical output of the transceiver is looped back to the optical input of the transceiver. A host computer coupled to the transceiver sends control signals to the transceiver to set the DC bias level of the transmitter, set the AC bias level of the transmitter, and to read the digital value of the "average received optical power" signal from the memory in the transceiver. The host computer sweeps the AC bias level through a range of values and observes the "average received optical power" at each AC bias level. For a constant DC bias level, the "average received optical power" remains substantially constant until the AC bias level reaches the point at which the operation of the laser diode becomes non-linear. At this point, the "average received optical power" increases, because the "1 level" increases more than the "0 level" decreases. The AC bias level is set to a level corresponding to, or equal to, the highest AC bias level at which the "average received optical power" remains substantially equal to the "average received optical power" associated with lower AC bias levels. In other words, the AC bias level is set to the level just before the transition of the laser diode operation from linear to nonlinear. From another perspective, the AC bias level is set to maximize, or almost maximize, the extinction ratio, while maintaining the average optical power associated with lower AC bias levels.

The above process is performed in a temperature control chamber and repeated over a series of pre-defined temperatures, sometimes herein called the calibration temperatures. The AC bias levels from the calibration temperatures are interpolated to generate AC bias levels for a multitude of intermediate temperatures within the range of operating temperatures for the optoelectronic transceiver. DC bias levels for the same intermediate temperatures are generated by interpolating the DC bias levels for the calibration temperatures. The resulting set of DC and AC bias levels are then stored in the transceiver's memory to be accessed during operation of the transceiver at corresponding temperatures within the transceiver's temperature operating range.

Optoelectronic Transceiver

Figure 2:
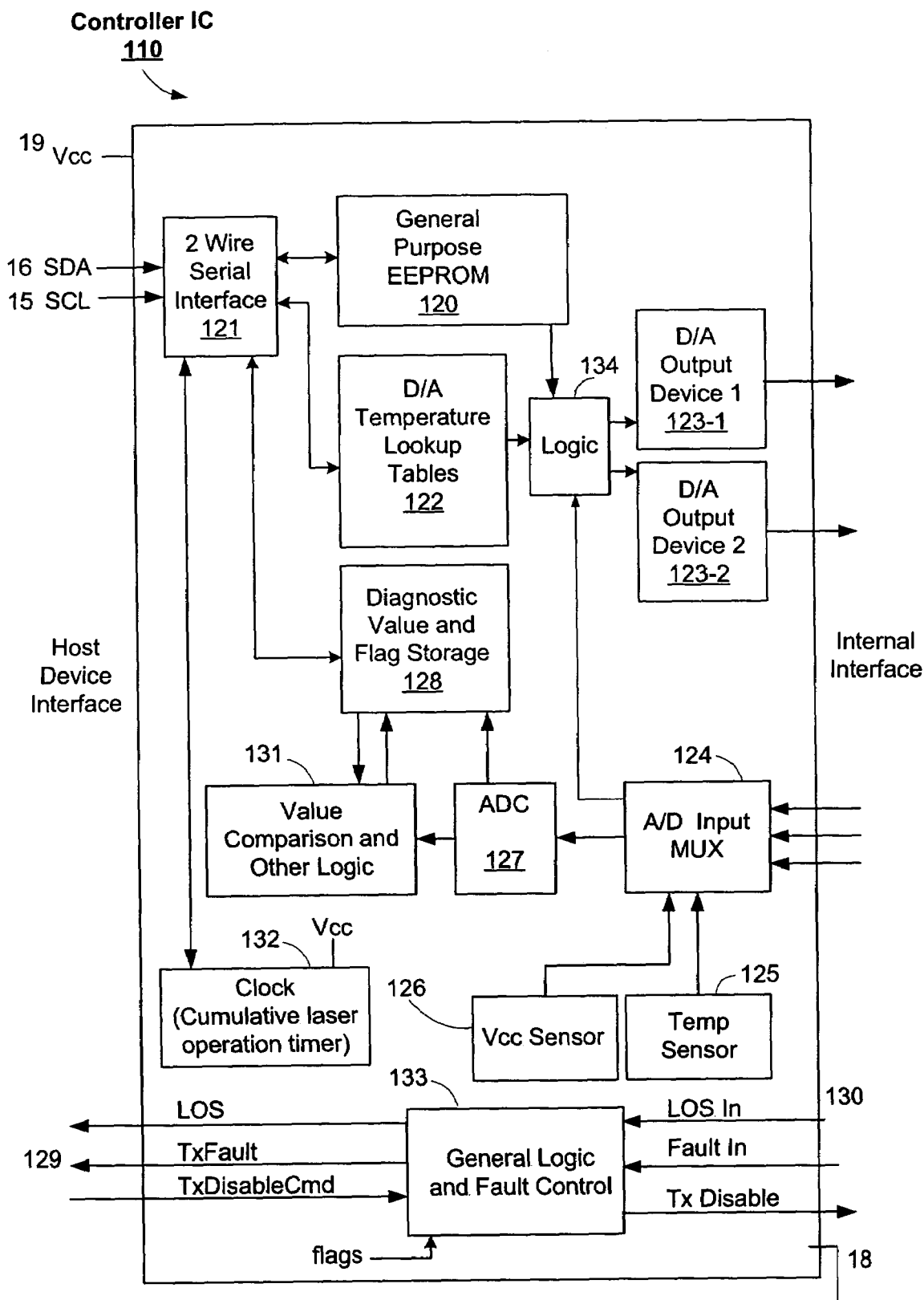
FIG. 2 is a block diagram of modules within the controller IC of the optoelectronic transceiver of FIG. 1.

An optoelectronic transceiver 100, suitable for testing and configuring using the testing and configuration apparatus described below, is shown in FIGS. 1 and 2. The transceiver 100 contains a receiver circuit, a transmitter circuit, and power supply voltage 19 and ground connections 18. The receiver circuit of the transceiver includes a Receiver Optical Subassembly (ROSA) 102, which may contain a mechanical fiber receptacle as well as a photodiode and pre-amplifier (preamp) circuit. The ROSA 102 is in turn connected to a post-amplifier (postamp) integrated circuit 106, the function of which is to generate a fixed output swing digital signal which is connected to outside circuitry via the RX+ and RX− pins 17. The postamp circuit 106 also often provides a digital output signal known as Signal Detect or Loss of Signal indicating the presence or absence of suitably strong optical input.

The transmit circuit of the transceiver includes a Transmitter Optical Subassembly (TOSA) 104 and a laser driver integrated circuit 108. The TOSA 104 contains a transmitter, generally a laser diode or LED, and may also include a mechanical fiber receptacle. As an alternative to mechanical fiber receptacles, some transceivers use fiber optic pigtails, which are standard, male fiber optic connectors. The laser driver circuit 108 provides AC drive and DC bias current to the laser diode or LED in the TOSA 104. The signal inputs for the laser driver 108 are obtained from the TX+ and TX− pins 12.

In addition to the basic functions described above, some transceiver platform standards involve additional functionality. Examples of this are the TX disable 13 and TX fault 14 pins described in the GBIC standard, as well as other optoelectronic transceiver standards. In these transceiver standards, the TX disable pin allows the transmitter to be shut off by the host device, while the TX fault pin is an indicator to the host device of some fault condition existing in the laser or associated laser driver circuit. In addition, these standards define how these controls function and interact with each other to implement reset operations and other actions. Some of this functionality is aimed at preventing non-eyesafe emission levels when a fault conditions exists in the laser circuit. These functions may be integrated into the laser driver circuit itself or in a controller integrated circuit 110. Finally, many of the optoelectronic transceiver standards also require that a memory device in the transceiver 100 store standardized serial ID information that can be read out via a serial interface (defined as using the serial interface of the ATMEL AT24C01A family of EEPROM products) having a clock line (SCL) 15 and a data (SDA) 16 line.

Control and setup functions of the transceiver 100 are implemented with the controller IC 110, which in a preferred embodiment is implemented as a single-chip integrated circuit. All the components of the transceiver 100 are preferably located in a protective housing except for connectors that may protrude from the housing. Suitable housings, including metallic, plastic, potting box and other housing structures are well known in the art.

The controller IC 110 handles all low speed communications with a host device. These include the standardized pin functions such as Loss of Signal (LOS) 11, Transmitter Fault Indication (TX FAULT) 14, and the Transmitter Disable Input (TXDIS) 13. The controller IC 110 has a two wire serial interface 121, also called the memory interface, for reading and writing to memory mapped locations in the controller.

The interface 121 is coupled to host device interface input/output lines, typically clock (SCL) and data (SDA) lines, 15 and 16. In one embodiment, the serial interface 121 operates in accordance with the two wire serial interface standard that is also used in the GBIC (Gigabit Interface Converter) and SFP (Small Form Factor Pluggable) standards. Other interfaces could be used in alternate embodiments. The two wire serial interface 121 is used for all setup and querying of the controller IC 110, and enables access to the optoelectronic transceiver's control circuitry as a memory mapped device. That is, tables and parameters are set up by writing values to predefined memory locations of one or more memory devices 120, 122, 128 (e.g., EEPROM devices) in the controller, whereas diagnostic and other output and status values are output by reading predetermined memory locations of the same memory devices 120, 122, 128. At least some of these memory devices are nonvolatile memory devices that retain the values stored in them even when electrical power is not provided to the transceiver 100. The serial interface 121 is consistent with currently defined serial ID functionality of many transceivers where a two wire serial interface is used to read out identification and capability data stored in an EEPROM.

It is noted here that some of the memory locations in the memory devices 120, 122, 128 are dual ported, or even triple ported in some instances. That is, while these memory mapped locations can be read and in some cases written via the serial interface 121, they are also directly accessed by other circuitry in the controller IC 110. For instance, certain "margining" values stored in memory 120 are read and used directly by logic 134 to adjust (i.e., scale upwards or downwards) drive level signals being sent to the digital to analog output devices 123. Similarly, there are flags stored memory 128 that are (A) written by logic circuit 131, and (B) read directly by logic circuit 133. An example of a memory mapped location not in the memory devices but that is effectively dual ported is the output or result register of clock 132. In this case the accumulated time value in the register is readable via the serial interface 121, but is written by circuitry in the clock circuit 132.

In addition to the result register of the clock 132, other memory mapped locations in the controller may be implemented as registers at the input or output of respective sub-circuits of the controller. For instance, the margining values used to control the operation of logic 134 may be stored in registers in or near logic 134 instead of being stored within memory device 128.

As shown in FIGS. 1 and 2, the controller IC 110 has connections to the laser driver 108 and receiver components. These connections serve multiple functions. The controller IC 110 has a multiplicity of digital to analog converters 123. In one embodiment the digital to analog converters are implemented as current sources, but in other embodiments the digital to analog converters may be implemented using voltage sources, and in yet other embodiments the digital to analog converters may be implemented using digital potentiometers. In some embodiments, the output signals of the digital to analog converters are used to control key parameters of the laser driver circuit 108. In particular, outputs of the digital to analog converters 123 are used to control the DC bias current as well as the AC bias or AC modulation level of the electrical signal applied by the laser driver circuit 108 to the laser or LED in TOSA 104.

In some embodiments, the controller IC 110 includes mechanisms to compensate for temperature dependent characteristics of the laser in TOSA 104. This is implemented in the controller IC 110 through the use of temperature lookup tables 122 that are used to assign values to the control outputs of the controller 110 as a function of the temperature measured by a temperature sensor 125 within the controller IC 110 and/or the temperature measured by a temperature sensor in or near the TOSA 104. In particular, a current temperature value is obtained from a temperature sensor (e.g., sensor 125) either in the controller or in or near the TOSA 104. That temperature value is converted into a digital value (by analog to digital converter (ADC) 127), and rounded or otherwise processed if necessary to form an index value for indexing into the temperature lookup tables 122. The index value is then used to lookup or access the DC and AC bias settings in the memory 122 (temperature lookup tables) corresponding to the current temperature in the transceiver. These DC and AC bias settings are converted into analog signals by one or more digital to analog converters 123, and the resulting analog signals are used to control the operation of the laser driver 108, which in turn controls the laser diode or LED in the TOSA 104. In a preferred embodiment, the outputs of digital to analog converters 123 are current signals. In other embodiments, the controller IC 110 may use digital to analog converters with voltage source outputs or may even replace one or more of the digital to analog converters 123 with digital potentiometers to control the characteristics of the laser driver 108 in accordance with the DC and AC bias settings obtained from the lookup tables in memory 122. It should also be noted that while FIG. 1 refers to a system where the laser driver 108 is specifically designed to accept inputs from the controller IC 110, it is possible to use the controller IC 110 with many other laser drivers to control their output characteristics.

In addition to the connection from the controller IC 110 to the laser driver 108, FIG. 1 shows a number of connections from the laser driver 108 to the controller IC 110, as well as similar connections from the ROSA 102 and Postamp 106 to the controller IC 110. These are analog monitoring connections that the controller IC 110 uses to provide diagnostic feedback to the host device via memory mapped locations in the controller IC 110. The controller IC 110 in one embodiment has a multiplicity of analog inputs. The analog input signals indicate operating conditions of the transceiver and/or receiver circuitry. These analog signals are scanned by a multiplexer ("mux") 124 and converted using an analog to digital converter ("ADC") 127. The ADC 127 has 12 bit resolution in one embodiment, although ADC's with other resolution levels may be used in other embodiments. The converted values are stored in predefined memory locations, for instance in the diagnostic value and flag storage device 128 shown in FIG. 2, and are accessible to the host device via memory mapped read operations. These values are calibrated to standard units (such as millivolts or microwatts) as part of a factory calibration procedure.

Figure 3:
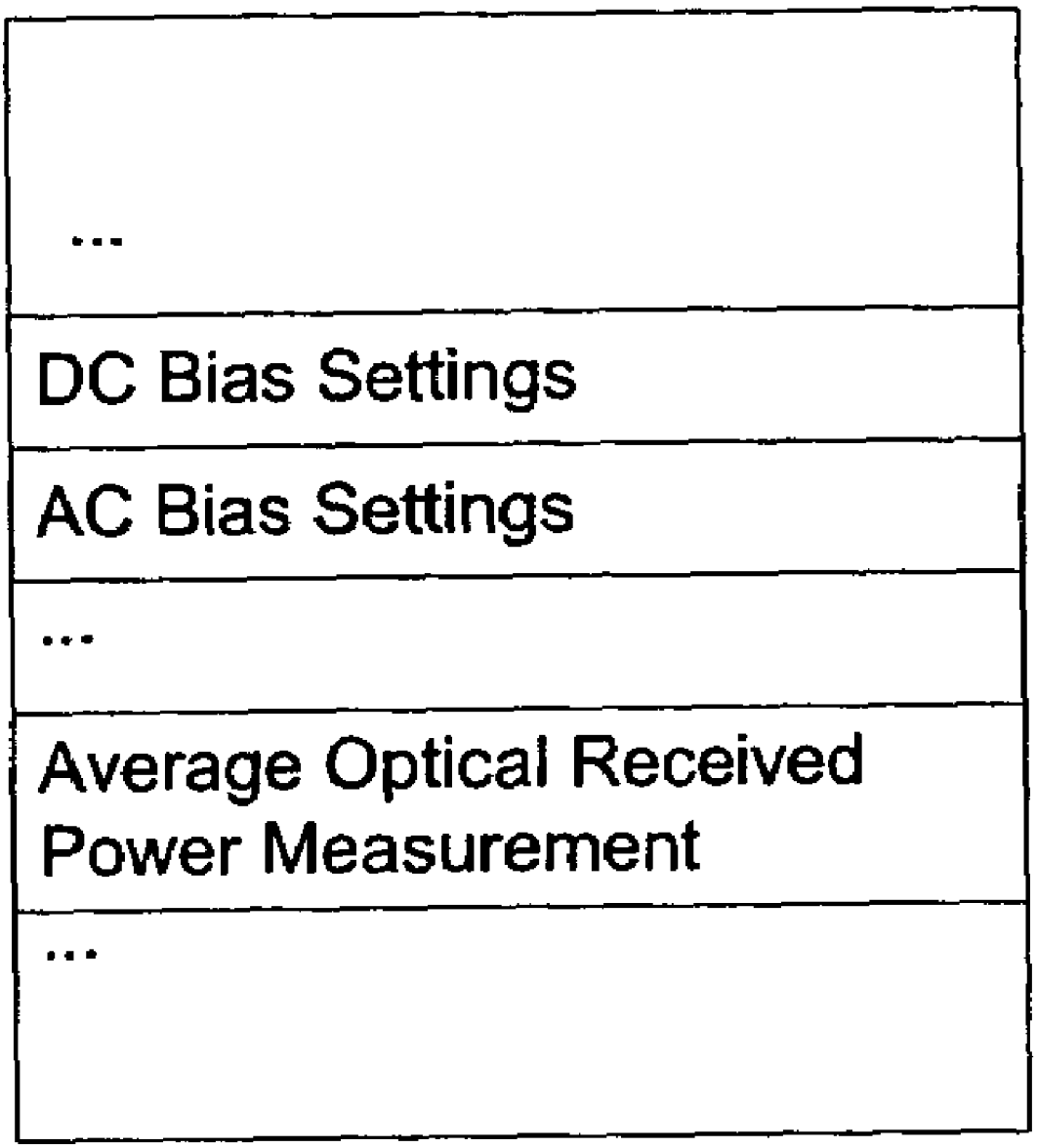
FIG. 3 is a block diagram depicting memory mapped locations within the controller IC of the optoelectronic transceiver of FIG. 1.

FIG. 3 is a block diagram depicting memory mapped locations within the controller IC 110 of the optoelectronic transceiver 100 of FIG. 1. The controller IC 110 has a two wire serial interface 121, also called the memory interface, for accessing memory mapped locations in the controller. The memory mapped locations shown in FIG. 3 are an exemplary memory map for one embodiment of a transceiver controller. The digitized quantities stored in memory mapped locations within the controller IC 110 include, but are not limited to, the DC bias settings, the AC bias settings, and a current value of the average optical received power measurement. These digitized quantities are stored in the memory mapped locations during the testing and configuration process described below in reference to FIGS. 4 and 5.

As shown in FIG. 2, the controller IC 110 includes a voltage supply sensor 126. An analog voltage level signal generated by this sensor 126 is converted to a digital voltage level signal by the ADC 127, and the digital voltage level signal is stored in memory 128. Similarly, the temperature sensor 125 in the controller IC 110 generates a signal that is converted by the ADC 127 into a digital temperature level signal, and the digital temperature level signal is stored in memory 128. In one embodiment, the analog to digital input multiplexer 124 and ADC 127 are controlled by a clock signal so as to automatically, periodically convert the monitored signals into digital signals, and to store those digital values in memory 128.

Optoelectronic Transceiver Testing and Configuration Apparatus

Figure 4:
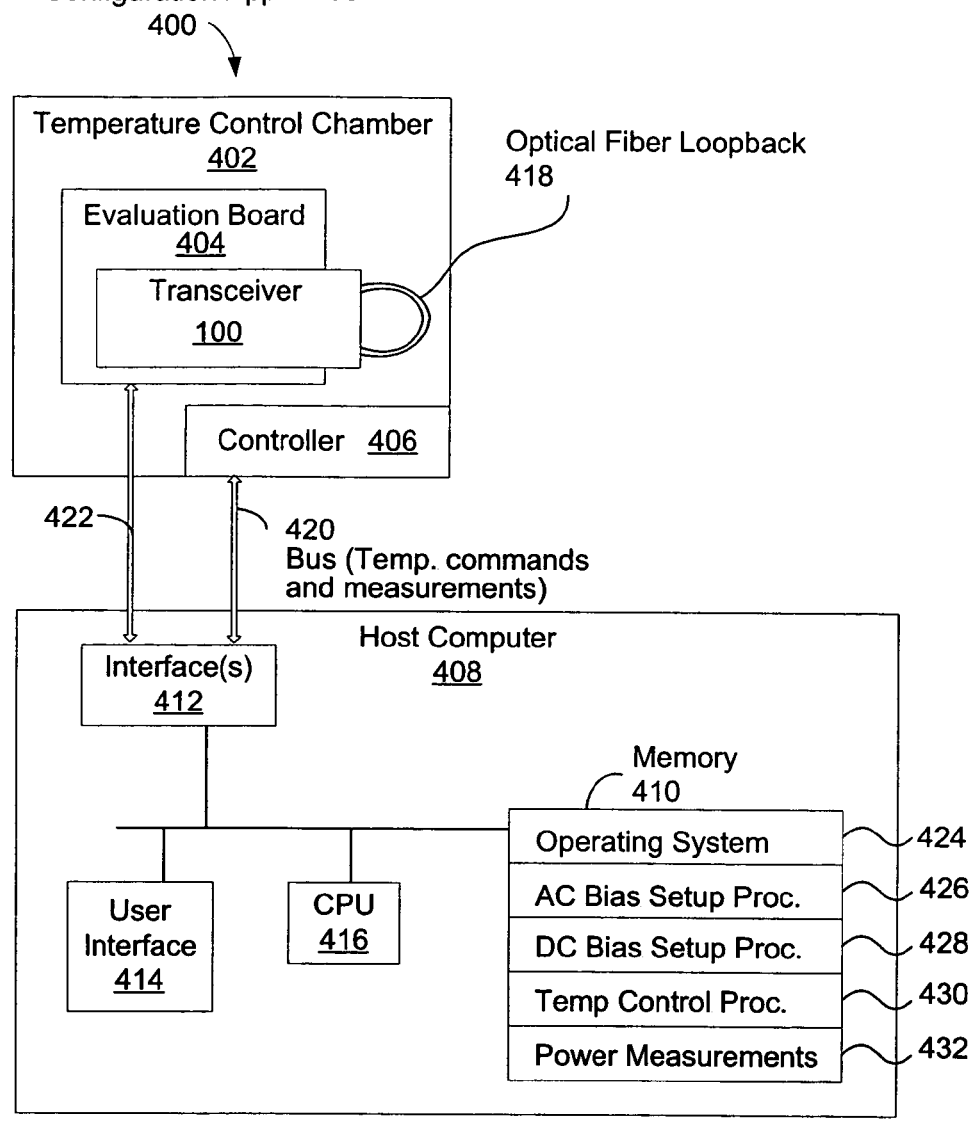
FIG. 4 is a block diagram of components of an optoelectronic transceiver testing and configuration apparatus.

FIG. 4 is a block diagram of components of an optoelectronic transceiver testing and configuration apparatus 400 in accordance with some embodiments. The optoelectronic transceiver testing and configuration apparatus 400 includes a temperature control chamber 402 coupled to a host computer 408. An evaluation board 404, which serves as an interface between the host computer 408 and the transceiver 100, is located within the temperature control chamber 402. Connected to the evaluation board 404 is at least one transceiver 100 to be tested and configured. The evaluation board or test temperature chamber apparatus typically includes a data pattern generator 401 (FIG. 4A), for providing a time varying data signal to the transceiver(s) being tested and configured. The data signal may be a pseudorandom data sequence, or any other time varying data sequence.

In some embodiments, the optoelectronic transceiver testing and configuration apparatus 400 is capable of simultaneously testing and configuring multiple transceivers 100 simultaneously. In some embodiments (see FIG. 4A), multiple optoelectronic transceivers can be mounted on the evaluation board 404, and in some embodiments multiple evaluation boards (each having one or more transceivers mounted thereon) can be placed in the temperature control chamber 402 simultaneously. In embodiments (see FIG. 4A) where the evaluation board 404A includes interfaces for receiving multiple transceivers, the evaluation board may include a multiplexer 409 for selectively coupling one transceiver at a time to the host computer 408. Alternately, or in addition, the temperature control chamber 402 may include a multiplexer 407 for selectively coupling the transceivers in the chamber to the host computer 408. Typically, the host computer 408 will issue a signal or command specifying the transceiver 100 to be coupled to the host computer, and that signal or command causes the multiplexer or multiplexers 407, 409 to be set so as to couple the specified transceiver to the host computer.

Referring again to FIG. 4, the transceiver 100 has its optical output looped back into its optical input by means of an optical fiber loopback 418. By looping the transceiver's 100 optical output back into its optical input, an optical test signal generated by the controller IC 110 can be utilized to test and configure the transceiver 100 without the use of a digital communication analyzer.

The host computer 408 preferably contains a user interface 414, one or more interfaces 412 for connection to the temperature control chamber 402 and the evaluation board 404, a central processing unit ("CPU") 416 and memory 410. Memory 410 may include high speed random access memory and may also include nonvolatile mass storage, such as one or more magnetic disk storage devices. Memory 410 may include mass storage that is remotely located from the central processing unit(s) 416. The memory 410 preferably stores an operating system 424, AC Bias setup procedures 426, DC Bias setup procedures 426, temperature control procedures 430, and power measurements 432. The operating system 424 stores instructions for communicating, processing data, accessing data, storing data, searching data, etc. The AC bias setup procedures 426 are a set of instructions (see FIG. 5) that test and configure the transceiver 100. The DC bias setup procedures 428 also test and configure the transceiver 100, and are designed to achieve predefined optical output power levels at specific temperatures based on certain predetermined criteria. These predetermined criteria preferably include device life, transmission distance, and other device performance characteristics. The temperature control procedures 430 control operation of the temperature control chamber 402, for instance by sending temperature settings to a controller 406 for the temperature control chamber 402. The power measurements 432 are recorded in the memory 410 for use in computing DC and AC bias levels at predefined temperatures (see FIG. 5).

The host computer 408 controls the function of the temperature control chamber 402 and the transceiver 100 being tested and configured. The host computer 408 is coupled at its interface 412 to the temperature control chamber 402 via a bus 420 that transmits temperature commands and measurements between the host computer 408 and the temperature control chamber 402. Similarly, the host computer 408 is coupled at its interface 412 to the evaluation board 404 via a bus 422 that transmits DC and AC bias level and optical power level commands and measurements between the host computer 408 and the transceiver 100.

The host computer 408 processes and records the settings and measurements made during the optoelectronic transceiver testing and configuration process. These settings and measurements preferably include the optical power level, temperature and DC and AC bias levels. In embodiments where there are multiple transceivers 100 in the temperature control chamber 402, the host computer 408 is selectively coupled to each of the transceivers 100 in the temperature control chamber 402 while the chamber is held at each calibration temperature, enabling the host computer 408 to test and calibrate each of the transceivers at that calibration temperature.

Figure 5:
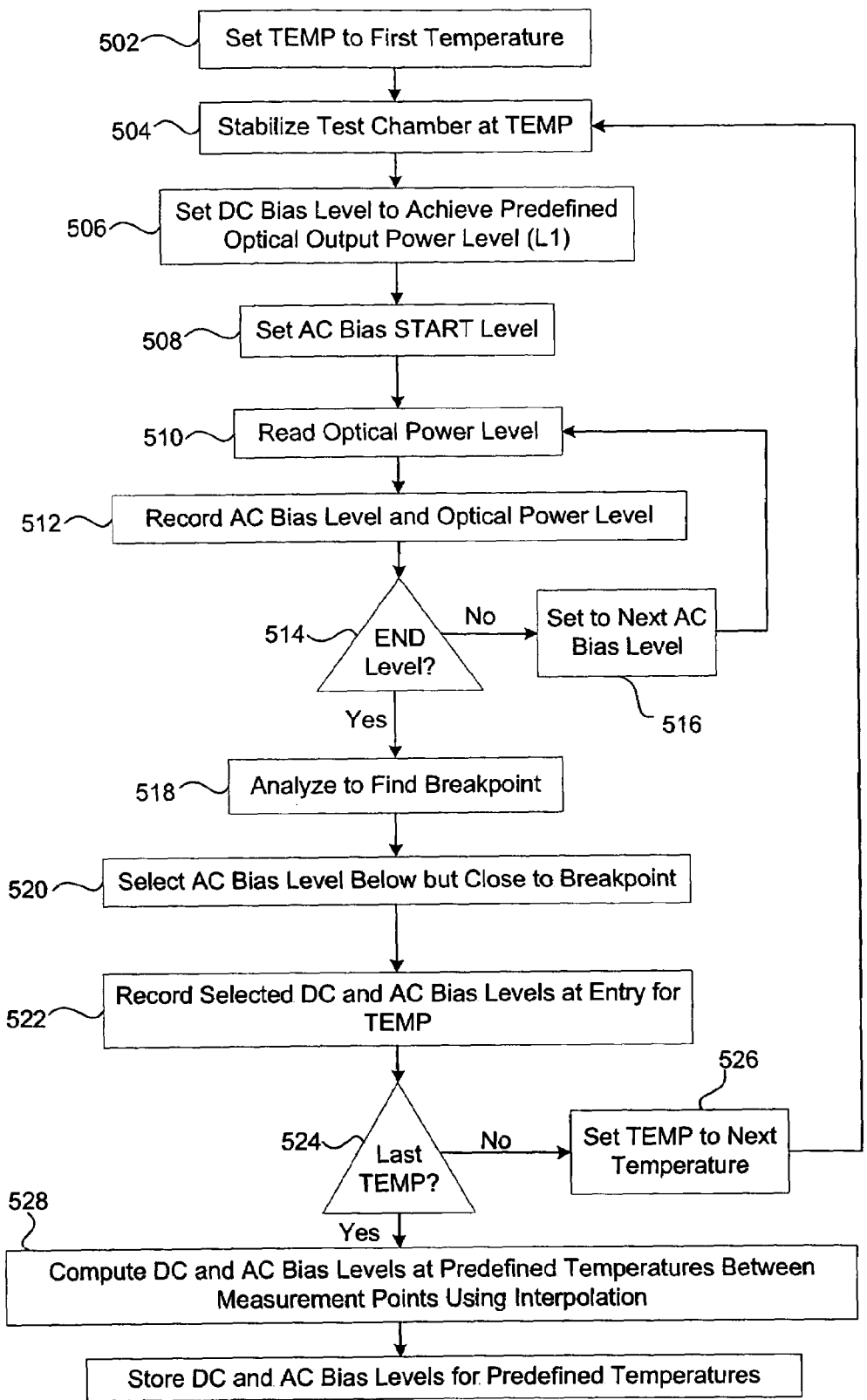
FIG. 5 is a flowchart of a method for setting the AC bias levels for an optoelectronic transceiver.

FIG. 5 is a flow-chart of a method for setting the AC bias point of an optical transmitter module, preferably a laser diode, in an optoelectronic transceiver. Once the transceiver is placed in the temperature control chamber 402, or similar temperature controlled environment, the first step 502 is to set the temperature control chamber to the first temperature at one end of the temperature calibration range. The temperature calibration range is preferably substantially similar to or greater than the operating range of the optoelectronic transceiver. The next step 504 is to stabilize the temperature control chamber 402 at the first temperature. The DC bias level is set in the next step 506 to achieve a predefined optical output power level. The predefined optical output power level is based on predetermined criteria such as the life of the laser diode, the transmission length of the optical signal, and other similar device performance characteristics. Furthermore, as explained above, the DC bias level is determined under control of the host computer 408 by repeatedly setting the transceiver's DC bias level (i.e., by storing a DC bias level value at an appropriate memory mapped location in the controller IC of the transceiver), reading the resulting average output optical power at a predefined memory mapped location in the controller IC, and then adjusting the DC bias level if necessary, until the predefined optical output power level is achieved.

The next step 508 is to set the AC bias level of the laser diode to the start of the testing range. The AC bias level testing range encompasses the known or likely region where the laser diode transitions from linear to non-linear operation based on previous testing of the product line. The optical output power level or measurement is then read in the next step 510. The AC bias level and the optical output power level or measurement are recorded temporarily in the next step 512 for later calculation. To compensate for noise present in the measurement system, the recorded optical power level is the average optical power level read over a given time period (e.g., 0.1 seconds).

Figure 6:
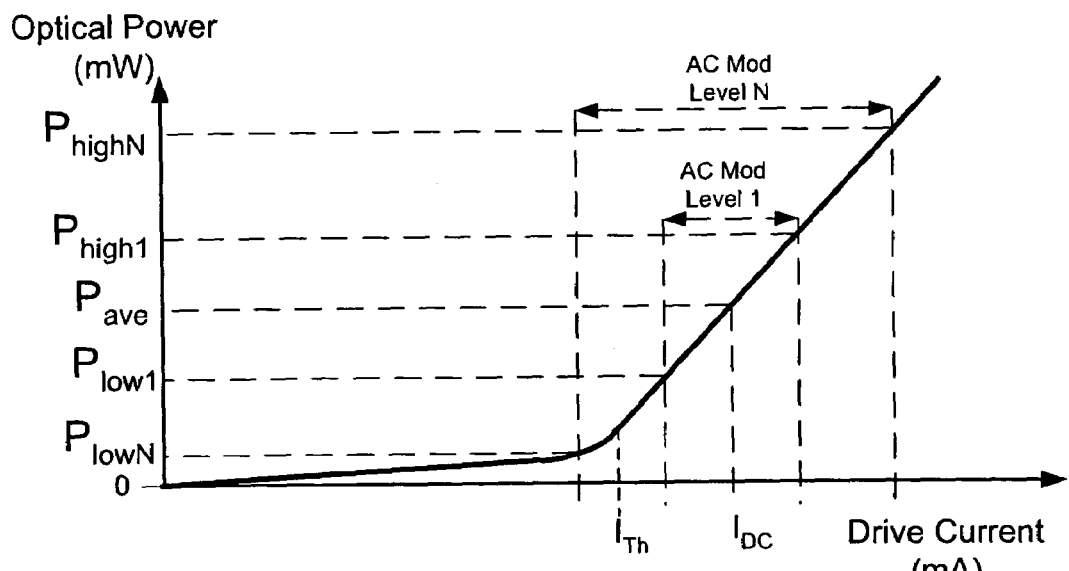
FIG. 6 is a graph of optical output power of an optoelectronic transmitter, such as a laser diode, as a function of the drive current applied to the transmitter.

Referring to FIG. 6, the optical output power level, $P_{ave}$ associated with the DC bias setting is shown. At low drive currents, the laser acts like a light emitting diode (LED). As the drive current increases, it reaches a threshold level, above which lasing action begins. Above the threshold, the laser diode's power increases linearly with increases in drive current. This region of operation is called the linear region or linear range of the laser diode.

As shown in FIG. 6, a first AC bias setting causes a first AC modulation level of the optical signal. At this bias setting, the peak optical output power, $P_{high1}$, and the low optical output power, $P_{low1}$, associated with the maximum and minimum current levels applied to the laser diode, are evenly spaced above and below the $P_{ave}$ optical output power level. Thus, the average optical output power remains unchanged by the AC modulation of the optical output signal at this first AC bias setting. A series of increasing large AC bias settings are applied to the laser diode in a transceiver. Eventually, at the AC bias setting herein labeled setting N, the minimum current level applied to the laser diode falls below the threshold current level for the laser diode, and the optical output power level is zero (or very close to zero) at this current level. As a result, the peak optical output power, $P_{highN}$, and the low optical output power, 0, associated with the maximum and minimum current levels applied to the laser diode, are no longer evenly spaced above and below the $P_{ave}$ optical output power level. Since the peak optical output power level has risen more than the low optical output power has fallen, at AC bias setting N, the average optical output power rises above the $P_{ave}$ optical output power level. At even higher AC bias settings, larger than AC bias setting N, the average optical output power will be even higher.

Figure 7:
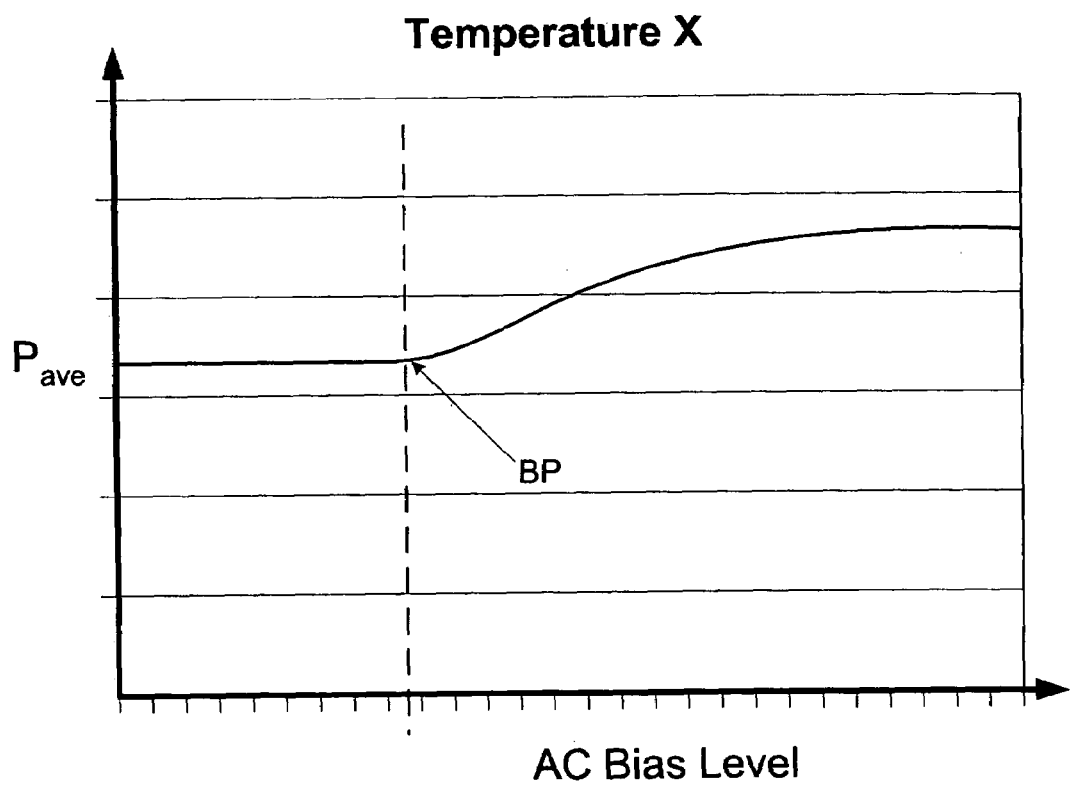
FIG. 7 is a graph of average optical output power of an optoelectronic transmitter as a function of AC bias level.

FIG. 7 is a graph showing the average optical power $P_{ave}$ of the laser diode plotted as a function of the AC bias level. The average optical power $P_{ave}$ remains substantially constant, or linear, until the AC bias level reaches a breakpoint BP at which the operation of the laser diode becomes non-linear. The breakpoint BP is calculated in step 518 of the procedure shown in FIG. 5, as discussed below. The breakpoint BP is the AC bias level at which the second derivative of the curve representing the average optical power $P_{ave}$ of the laser diode plotted as a function of the AC bias level reaches a maximum value, indicating a sharp inflection in the curve. Typically, the breakpoint BP is slightly higher than the highest AC bias level at which the average optical output power is at the same level as for lower AC bias levels.

Returning to the explanation of the procedures represented by FIG. 5, a decision step 514 determines if the current AC bias level is the last level of the testing range. If the current AC bias level is not the last level of the testing range, then the next step 516 is to set the AC bias level to the next level to be tested and return to the read optical power step 510 and repeat the recording 512 and determining 514 steps until the current AC bias level is the last level of the testing range (i.e., repeat steps 510–516 until END level reached). Once the current AC bias level is the last level of the testing range, an analysis step 518 is performed to find the breakpoint in the average optical power $P_{ave}$/AC bias level curve (see FIG. 7).

The AC bias level is selected at the next step 520 at a level corresponding to, or equal to, the highest AC bias level at which the average optical power $P_{ave}$ remains substantially constant, or linear. This AC bias level is below but close to the breakpoint BP.

In the next step 522, the selected AC bias level is recorded at an entry (e.g., in a table in memory) for the current test chamber temperature. A decision step 524 then determines if the current temperature is the last temperature in the temperature calibration range. If the current temperature is not the last temperature in the temperature calibration range, then the next step 526 is to set the temperature to the next temperature in the temperature calibration range and return to the stabilize the temperature control chamber step 504. Steps 504–524 are repeated until the current temperature is the last temperature in the temperature calibration range.

Once the current temperature is the last temperature in the temperature calibration range, a computation step 528 is performed to compute the DC and AC bias levels at predefined temperatures between the temperatures in the temperature calibration range. The computation step 528 is performed by interpolating the recorded DC and AC bias values for the calibration temperatures (recorded at step 522) so as generate DC and AC bias values for predefined temperatures between the calibration temperatures. The interpolated DC and AC bias levels for the predefined temperatures are stored (step 530) at memory mapped locations in the temperature lookup tables 122 of the controller IC 110 (see FIGS. 2 and 3) in the transceiver 100. If the calibration temperatures correspond to temperatures in the lookup tables 122, then the DC and AC bias levels for those temperatures, recorded at step 522, are also stored in the temperature lookup tables 122.

In embodiments in which multiple transceivers are tested and calibrated simultaneously, certain steps of the procedures represented by FIG. 5 are repeated for each respective transceiver in the test chamber. In particular, steps 506, 508, 510 and 512 are each repeated for every respective transceiver in the test chamber before the calibration procedure moves onto the next step. Similarly, AC bias selection and recording steps 518, 520 and 522 are performed for each respective transceiver before steps 524, 526 are performed. Finally, interpolation and recording steps 528 and 530 are performed for each respective transceiver.

ALTERNATE EMBODIMENTS

Some aspects of the present invention can be implemented as a computer program product that includes a computer program mechanism embedded in a computer readable storage medium. For instance, the computer program product could contain the program modules shown in FIGS. 4 and 5. These program modules may be stored on a CD-ROM, magnetic disk storage product, or any other computer readable data or program storage product. The software modules in the computer program product may also be distributed electronically, via the Internet or otherwise, by transmission of a computer data signal (in which the software modules are embedded) on a carrier wave.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method for establishing an AC bias level for a laser diode in an optoelectronic transceiver, comprising:
    coupling an optical output of said transceiver to an optical input of said transceiver;
    setting a DC bias level for said laser diode;
    receiving from said transceiver a sequence of optical output power measurements associated with a corresponding sequence of AC bias level settings;
    from said received sequence of optical output power measurements determining a preferred AC bias level setting;
    establishing said preferred AC bias level setting in said transceiver so as to control said AC bias level of said laser diode;
    determining a break point associated with the sequence; and
    selecting an AC bias level corresponding to said determined break point.

2. A method for establishing an AC bias level for a laser diode in an optoelectronic transceiver, comprising:
    coupling an optical output of said transceiver to an optical input of said transceiver;
    setting a DC bias level for said laser diode;
    setting an AC bias level for said laser diode to each of a sequence of AC bias level settings;
    receiving from said transceiver a sequence of optical output power measurements, including an average optical output power measurement corresponding to each of said AC bias level settings in said sequence;
    from said received sequence of power level measurements determining a preferred AC bias level setting; and establishing said preferred AC bias level setting in said transceiver so as to control said AC bias level of said laser diode;

determining a break point associated with the sequence; and selecting an AC bias level corresponding to said determined break point.

3. The method of claim 2, further comprising:
repeating said receiving, determining and storing at a first plurality of temperatures.

4. The method of claim 2, wherein the break point is a break point in the sequence of optical output power measurements corresponding to a boundary between linear and non-linear operation of said laser diode.

5. The method of claim 2, wherein the break point is a break point corresponding to a maximum value of a second derivative of the sequence of optical output power measurements, wherein the second derivative is defined with respect to the AC bias level settings corresponding to optical output power measurements in said sequence of optical output power measurements.

6. The method of claim 5, wherein selecting an AC bias level includes selecting an AC bias level that is at a predetermined offset from said break point.

7. The method of claim 2, wherein said receiving further comprises:
reading a digital value from a controller IC in said transceiver.

8. The method of claim 2, wherein said storing further comprises:
storing a digital value in a controller IC in said transceiver.

9. The method of claim 2, further comprising:
transmitting data through said transceiver while receiving said optical output power measurements.

10. The method of claim 2, wherein said receiving includes receiving said optical output power measurements from a memory mapped location within said transceiver.

11. A method for setting an AC bias level for a laser diode in an optoelectronic transceiver, comprising:
coupling an optical output of said transceiver to an optical input of said transceiver;
setting a DC bias level for said laser diode;
setting an AC bias level for said laser diode to each of a sequence of AC bias level settings;
receiving from said transceiver a sequence of optical output power measurements, said sequence of optical output power measurements including an average optical output power measurement corresponding to each of said AC bias level settings in said sequence;
from said received sequence of optical output power measurements determining a preferred AC bias level setting;
repeating said receiving and determining at a first plurality of temperatures so as to determine a first plurality of AC bias level settings, each corresponding to a respective temperature in said first plurality of temperatures;
determining from said first plurality of AC bias level settings, a second plurality of AC bias level settings for a second plurality of temperatures, wherein said second plurality of AC bias level settings are greater in number of than said first plurality of AC bias level settings;
storing said second plurality of AC bias level settings in said transceiver;
determining a break point associated with the sequence; and selecting an AC bias level corresponding to said determined break point.

12. The method of claim 11, wherein the break point is a break point in said sequence of optical output power measurements corresponding to a boundary between linear and non-linear operation of said laser diode.

13. The method of claim 11, wherein the break point is a break point corresponding to a maximum value of a second derivative of said sequence of optical output power measurements, wherein said second derivative is defined with respect to said AC bias level settings corresponding to optical output power measurements in said sequence of optical output power measurements.

14. The method of claim 13, wherein selecting an AC bias level includes selecting an AC bias level that is at a predetermined offset from said break point.

15. The method of claim 11, wherein said receiving further comprises:
reading a digital value from a controller IC in said transceiver.

16. The method of claim 11, wherein said storing further comprises:
storing a digital value in a controller IC in said transceiver.

17. The method of claim 11, further comprising:
transmitting data through said transceiver while receiving said optical output power measurements.

18. The method of claim 11, wherein said receiving includes receiving said optical output power measurements from a memory mapped location within said transceiver.

19. An apparatus for setting the AC bias level of a laser diode in an optoelectronic transceiver, comprising:
a test apparatus configured to receive a transceiver to be configured, said transceiver having its optical output coupled to its optical input; and
a control apparatus configured to control the operation of said test apparatus and to set an AC bias level of said transceiver based on measurements received from a memory mapped location within said transceiver wherein the AC bias level corresponds to a break point associated with a sequence of optical output power measurements.

20. The apparatus of claim 19, wherein said control apparatus is further configured to receive said measurements by reading digital values from a controller IC in said transceiver.

21. The apparatus of claim 20, wherein said control apparatus is further configured to set said AC bias level of said transceiver by storing a digital value in said controller IC in said transceiver.

22. The apparatus of claim 19, wherein said control apparatus is further configured to transmit data through said transceiver while receiving said optical output power measurements.

23. The apparatus of claim 19, wherein said test apparatus further comprises:
a temperature control chamber; and
an evaluation board configured to receive said transceiver.

24. An apparatus for setting the AC bias level of a laser diode in an optoelectronic transceiver, comprising:
a test apparatus configured to receive a transceiver to be configured, said transceiver having its optical output coupled to its optical input; and
a control apparatus configured to control the operation of said test apparatus and to set an AC bias level of said transceiver based on measurements received from said transceiver;

wherein said control apparatus is configured to perform a set operations, including:

set a AC bias level for said laser diode;

set an AC bias level for said laser diode to each of a predefined sequence of AC bias level settings;

receive from said transceiver a sequence of optical output power measurements, said sequence at optical output power measurements including an average optical output power measurement corresponding to each of said AC bias level settings in said predefined sequence;

from said received sequence of optical output power measurements, determine a preferred AC bias level setting;

store said preferred AC bias level setting in said transceiver so as to control said AC bias level of said laser diode;

determine a break point associated with the sequence; and select an AC bias level corresponding to said determined break point.

25. The apparatus of claim 24, wherein said control apparatus is further configured to:

repeat said receive, determine and store operations at a first plurality of temperatures.

26. The apparatus of claim 24, wherein the break point is a break point in the sequence of optical output power measurements corresponding to a boundary between linear and non-linear operation of said laser diode.

27. The apparatus of claim 24, wherein the break point is a break point corresponding to a maximum value of a second derivative of the sequence of optical output power measurements, wherein said second derivative is defined with respect to said AC bias level settings corresponding to optical output power measurements in said sequence of optical output power measurements.

28. The apparatus of claim 27, wherein said control apparatus is configured to select an AC bias level by selecting an AC bias level that is at a predetermined offset from said break point.

29. The apparatus of claim 24, wherein said control apparatus is configured to perform said receive operation by reaching a digital value from a controller IC in said transceiver.

30. The apparatus of claim 24, wherein said control apparatus is configured to perform said store operation by storing a digital value in a controller IC in said transceiver.

31. The apparatus of claim 24, further configured to transmit data through said transceiver while receiving said optical output power measurements.

32. The apparatus of claim 24, wherein said control apparatus is configured to perform said receive operation by receiving said optical output power measurements from a memory mapped location with said transceiver.

33. The apparatus of claim 24, wherein said test apparatus further comprises:

a temperature control chamber; and an evaluation board configured to receive said transceiver.

34. The apparatus of claim 24, wherein said test apparatus further comprises a temperature control chamber; and said control apparatus is further configured to repeat said receiving, determining and storing at a first plurality or temperatures.

* * * * *

UNITED STATES PATENT AND TRADEMARK OFFICE
CERTIFICATE OF CORRECTION

PATENT NO. : 7,120,179 B2 Page 1 of 1
APPLICATION NO. : 10/703698
DATED : October 10, 2006
INVENTOR(S) : Fennelley et al.

Figure 4A:
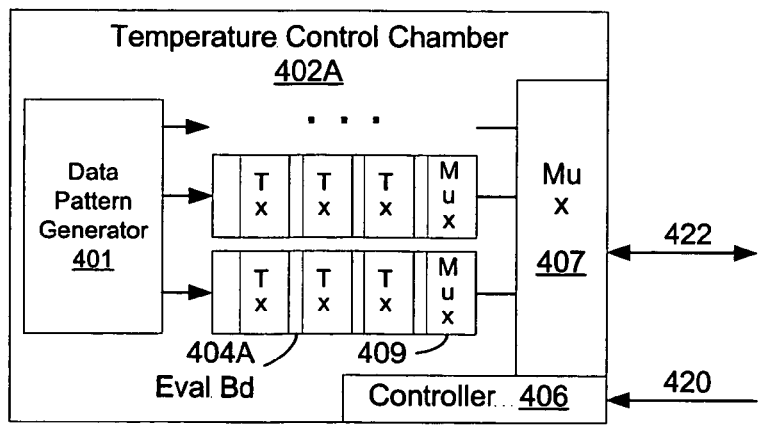
FIG. 4A is a block diagram of a temperature control chamber and evaluation board for use in an alternate embodiment.

It is certified that error appears in the above-identified patent and that said Letters Patent is hereby corrected as shown below:

Column 2
Line 2-3, begin a new paragraph at "FIG. 4A"

Column 7
Line 3, change "402" to --402A--
Line 28, after "DC Bias setup procedures", change "426" to --428--

Column 11
Line 63 claim 11, before "than said first", remove [of]

Column 13
Line 3 claim 24, change "AC" to --DC--

Signed and Sealed this

Nineteenth Day of August, 2008

JON W. DUDAS
*Director of the United States Patent and Trademark Office*